US010245780B2

(12) United States Patent
Muramoto et al.

(10) Patent No.: US 10,245,780 B2
(45) Date of Patent: Apr. 2, 2019

(54) EMBOSSED FILM, SHEET FILM, TRANSFER COPY, AND METHOD FOR PRODUCING EMBOSSED FILM

(71) Applicant: DEXERIALS CORPORATION, Tokyo (JP)

(72) Inventors: Yutaka Muramoto, Miyagi (JP); Masanao Kikuchi, Miyagi (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/523,182

(22) PCT Filed: Oct. 28, 2015

(86) PCT No.: PCT/JP2015/080331
§ 371 (c)(1),
(2) Date: Apr. 28, 2017

(87) PCT Pub. No.: WO2016/068166
PCT Pub. Date: May 6, 2016

(65) Prior Publication Data
US 2017/0326783 A1    Nov. 16, 2017

(30) Foreign Application Priority Data

Oct. 28, 2014   (JP) ................................. 2014-219753
Oct. 23, 2015   (JP) ................................. 2015-209376

(51) Int. Cl.
*B32B 3/00* (2006.01)
*B29C 59/02* (2006.01)
(Continued)

(52) U.S. Cl.
CPC .............. *B29C 59/022* (2013.01); *B05D 1/28* (2013.01); *B29C 59/046* (2013.01); *B05D 1/40* (2013.01);
(Continued)

(58) Field of Classification Search
CPC ..... B29C 59/022; B29C 59/046; B29C 35/10; B05D 1/28; B05D 1/40
See application file for complete search history.

(56) References Cited

U.S. PATENT DOCUMENTS

2009/0116095 A1   5/2009   Guerra
2013/0215515 A1   8/2013   Kinoshita et al.

FOREIGN PATENT DOCUMENTS

JP    2007-136680    6/2007
JP    2009-258751    11/2009
(Continued)

OTHER PUBLICATIONS

Sep. 19, 2018, Korean Office Action issued for related KR application No. 10-2017-7006077.
(Continued)

*Primary Examiner* — Elizabeth E Mulvaney
(74) *Attorney, Agent, or Firm* — Paratus Law Group, PLLC

(57) ABSTRACT

There is provided an embossed film in which the frequency of loss of concavities is smaller, the embossed film including: a film main body; and a plurality of concavities formed on a surface of the film main body. A diameter of an opening surface of the concavity is larger than a visible light wavelength, an arrangement pattern of the concavities has periodicity along a length direction of the film main body, and the difference between the rate of loss of concavities in one end portion of the film main body and the rate of loss of concavities in the other end portion of the film main body is 10 ppm or less.

32 Claims, 10 Drawing Sheets

X - XX

(51) Int. Cl.
*B05D 1/28* (2006.01)
*B29C 59/04* (2006.01)
*B05D 1/40* (2006.01)
*B29C 35/10* (2006.01)
*B29K 105/16* (2006.01)
*B29C 35/08* (2006.01)

(52) U.S. Cl.
CPC .......... *B05D 2252/02* (2013.01); *B29C 35/10* (2013.01); *B29C 2035/0827* (2013.01); *B29C 2059/023* (2013.01); *B29K 2105/16* (2013.01)

(56) References Cited

FOREIGN PATENT DOCUMENTS

| JP | 2014-060151 | 4/2014 |
|----|-------------|--------|
| WO | WO2012/018048 A1 | 2/2012 |
| WO | WO2014/034741 A1 | 3/2014 |

OTHER PUBLICATIONS

Jan. 9, 2018, Korean Office Action issued for related KR Application No. 10-2017-7006077.

Aug. 7, 2018, Korean Office Action issued for related KR Application No. 10-2017-7006077.

X – XX

X - XX

EMBOSSED FILM, SHEET FILM, TRANSFER COPY, AND METHOD FOR PRODUCING EMBOSSED FILM

CROSS-REFERENCE TO PRIOR APPLICATION

This application is a National Stage Patent Application of PCT International Patent Application No. PCT/JP2015/080331 (filed on Oct. 28, 2015) under 35 U.S.C. § 371, which claims priority to Japanese Patent Application Nos. 2015-209376 (filed on Oct. 23, 2015) and 2014-219753 (filed on Oct. 28, 2014), which are all hereby incorporated by reference in their entirety.

TECHNICAL FIELD

The present invention relates to an embossed film, a sheet film, a transfer copy, and a method for producing an embossed film.

BACKGROUND ART

These days, embossed films having concave-convex structures of various planar configurations are developed and used.

Examples of the method for producing such an embossed film include a method in which a concave-convex structure is formed on a sheet-like transfer destination film using a stamper master.

Specifically, a stamper master in which the inverted shape of a concave-convex structure that is to be formed on a film is formed on the surface of a flat plate-like substrate (transfer surface) is produced, and the stamper master is pressed against a transfer destination film; thereby, the shape of the transfer surface of the stamper master is transferred to the transfer destination film. By performing such transfer repeatedly, an embossed film on which a desired concave-convex structure is formed can be produced on almost the entire area of a sheet-like transfer destination film.

CITATION LIST

Patent Literature

Patent Literature 1: JP 2009-258751A

SUMMARY OF INVENTION

Technical Problem

However, in the method of producing an embossed film using a stamper master mentioned above, it has been difficult to accurately control the pressing position of the stamper master with respect to the transfer destination film. Hence, there has been a problem that a position shift occurs between the arrangement pattern of the concave-convex structure formed by one transfer of the stamper master and the arrangement pattern of the concave-convex structure formed by the next transfer.

Furthermore, as transfer is repeated, in the stamper master it is highly likely that convexities will be worn out or concavities will be filled with a peeled-off film. Hence, there has been a problem that, as the area of the embossed film to be produced becomes larger, the transferability of the concave-convex structure to the transfer destination film becomes lower and the frequency of loss of the concave-convex structure to be transferred becomes higher.

Patent Literature 1 discloses a method in which a film or the like having a moth-eye structure with a period of not more than visible light wavelengths is produced by a roll-to-roll system using a circular cylindrical or circular columnar master. However, the technology disclosed in Patent Literature 1 aims to form a concave-convex structure formed with a period of not more than visible light wavelengths (e.g., 1 μm or less), and therefore does not contribute to the solution of the issue mentioned above.

Thus, the present invention has been made in view of the issue mentioned above, and an object of the present invention is to provide a new and improved embossed film in which the frequency of loss of concavities in the transfer destination film is smaller, a sheet film obtained by cutting the embossed film, a transfer copy based on the embossed film, and a method for producing the embossed film.

Solution to Problem

According to an aspect of the present invention in order to achieve the above object, there is provided an embossed film including: a film main body; and a plurality of concavities formed on a surface of the film main body. A diameter of an opening surface of the concavity is larger than a visible light wavelength, an arrangement pattern of the concavities has periodicity along a length direction of the film main body, and the difference between the rate of loss of concavities in one end portion of the film main body and the rate of loss of concavities in the other end portion of the film main body is 10 ppm or less.

The rate of loss of concavities may be calculated on the basis of concavities in an area corresponding to the same arrangement pattern in one period of the arrangement pattern.

The film main body may be a long-length film.

The concavities formed on the film main body may have substantially the same shape.

The arrangement pattern of the concavities may be a lattice form.

The number density of the concavities may be 50,000,000/cm² or less.

The film main body may include a coating layer made of an inorganic compound in at least part of a surface including an interior of the concavity.

The film main body may be formed of a hardenable resin or a plastic resin.

According to another aspect of the present invention in order to achieve the above object, there is provided a sheet film formed by cutting the above embossed film into a plurality of sheets.

According to still another aspect of the present invention in order to achieve the above object, there is provided a transfer copy, in which, using the above embossed film or sheet film, a minute solid body is transferred in a position corresponding to the arrangement pattern.

According to still another aspect of the present invention in order to achieve the above object, there is provided a method for producing an embossed film, including: a step of forming a plurality of convexities on a peripheral surface of a circular cylindrical or circular columnar master; and a step of pressing the master against a transfer destination film while rotating the master to transfer concavities corresponding to a shape of the peripheral surface of the master to the transfer destination film and thereby producing a film main body. A diameter of an opening surface of the concavity is larger than a visible light wavelength, and the difference between the rate of loss of concavities in one end portion of the film main body and the rate of loss of concavities in the other end portion of the film main body is 10 ppm or less.

Advantageous Effects of Invention

As described above, according to the present invention, when concavities having an opening surface with a diameter larger than visible light wavelengths are formed on a film, the difference between the rate of loss of concavities in one end portion of the film and the rate of loss of concavities in the other end portion of the film can be reduced. Thus, even when an embossed film is formed with a large area, the frequency of loss of concavities can be made smaller.

DESCRIPTION OF EMBODIMENTS

Figure 1:
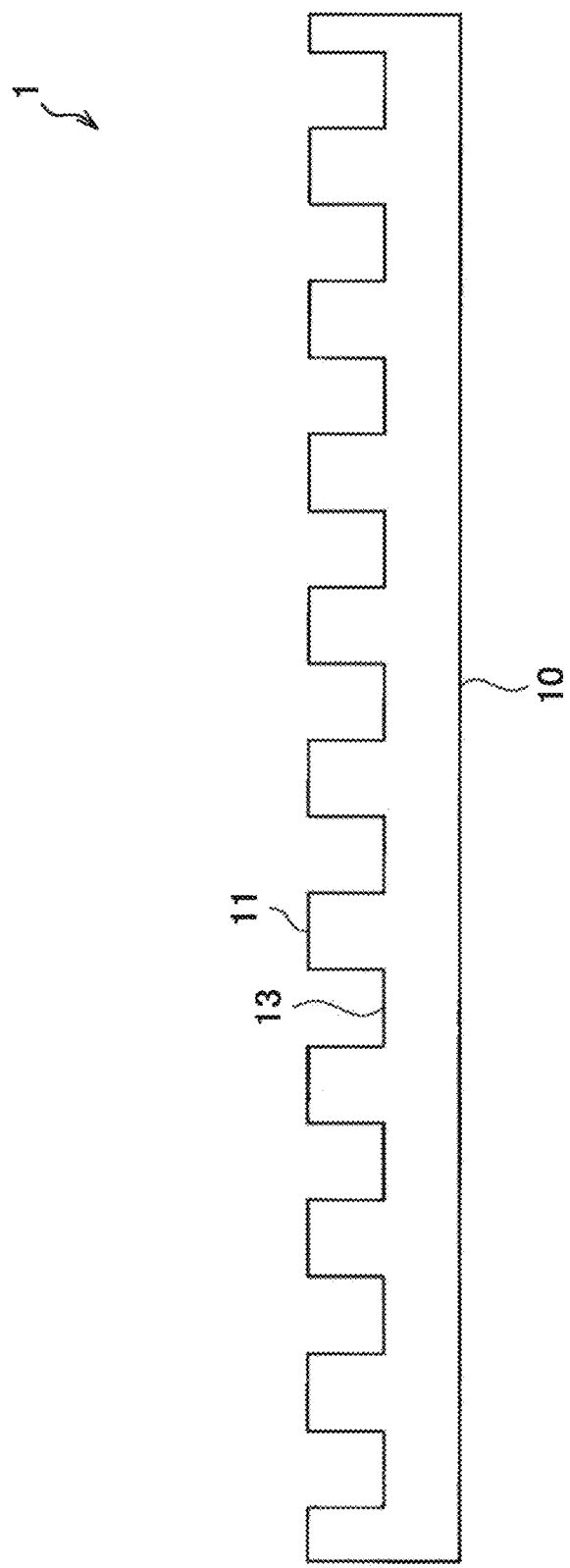
FIG. 1 is a cross-sectional view schematically showing a cross-sectional shape of an embossed film according to an embodiment of the present invention taken along the thickness direction.

Hereinafter, (a) preferred embodiment(s) of the present invention will be described in detail with reference to the appended drawings. In this specification and the appended drawings, structural elements that have substantially the same function and structure are denoted with the same reference numerals, and repeated explanation of these structural elements is omitted.

1. Embossed Film 1.1. Structure of Embossed Film

First, the structure of an embossed film according to an embodiment of the present invention is described with reference to FIG. 1 and FIG. 2. FIG. 1 is a cross-sectional view schematically showing a cross-sectional shape of an embossed film 1 according to the present embodiment taken along the thickness direction.

As shown in FIG. 1, the embossed film 1 according to the present embodiment has a film main body 10 and a plurality of convexities 11 and a plurality of concavities 13 formed on the surface of the film main body 10.

Here, the stacked structure of the embossed film 1 is not limited to the structure shown in FIG. 1. For example, the embossed film 1 may be formed as a stacked body in which a plurality of resin layers are stacked. For example, the embossed film 1 may have a structure in which a support body formed of a resin or the like (not illustrated) is stacked on the opposite surface to the surface of the film main body 10 on which the convexity 11 and the concavity 13 are formed. The support body may be formed of any resin, and may be formed of, for example, a polyethylene terephthalate (PET) resin or the like.

The film main body 10 is formed of a resin having hardenability or plasticity. When the film main body 10 is a resin having hardenability or plasticity, any known resin may be used. Specifically, the film main body 10 may be formed of a photocurable resin or a thermosetting resin, which is a hardenable resin, or may be formed of a thermoplastic resin (more specifically, a crystalline resin that melts by heat), which is a plastic resin. The resin having hardenability or plasticity may be mixed with another film-forming material.

In the case where the film main body 10 is formed of a thermoplastic resin, for example, the film main body 10 may be heated and softened, and then a circular cylindrical or circular columnar master may by pressed; thereby, the concave-convex structure formed on the surface of the master can be transferred to the film main body 10. In the case where the film main body 10 is formed of a photocurable resin, for example, a photocurable resin may be applied to a support body, and the photocurable resin may be cured by applying light while pressing a circular cylindrical or circular columnar master; thereby, the concave-convex structure formed on the surface of the master can be transferred to the film main body 10.

The thickness of the film main body 10 is not particularly limited, and may be, for example, not less than 8 μm and not more than 200 μm. In the case where the embossed film 1 is formed as a stacked body of a support body and the film main body 10, the thickness of the entire embossed film 1 is not particularly limited, and may be, for example, not less than 10 μm and not more than 300 μm. In such a case, the thickness of the film main body 10 alone may be not less than 1 μm and not more than 50 μm, and the thickness of the support body alone may be not less than 9 μm and not more than 250 μm.

The convexities 11 and the concavities 13 are a concave-convex structure formed on the film main body 10. Here, the planar and cross-sectional shapes of the convexity 11 and the concavity 13 are arbitrary, but the convexity 11 and the concavity 13 are formed such that the size of the planar shape thereof is larger than visible light wavelengths.

Specifically, the concavity 13 is formed such that the diameter of the opening surface is larger than visible light wavelengths. In the case where the shape of the opening surface of the concavity 13 is not a circle (in the case of a polygon or the like), the concavity 13 is formed such that the diameter of a circumscribed circle of the shape of the opening surface is larger than visible light wavelengths. However, in the case where the shape of the opening surface of the concavity 13 is a triangle or a rectangle, the concavity 13 may be formed such that the length of one side of the opening surface is larger than visible light wavelengths.

More specifically, the concavity 13 may be formed such that the diameter of the opening surface is not less than 0.8 μm and not more than 500 μm, preferably not less than 1.0 μm and not more than 300 μm, and more preferably larger than 1.6 μm and less than 300 μm. That is, the diameter of the opening surface of the concavity 13 is preferably 0.8 μm or more, more preferably 1.0 μm or more, and still more preferably larger than 1.6 μm. Further, the diameter of the opening surface of the concavity 13 is preferably 500 μm or less, more preferably 300 μm or less, and still more preferably less than 300 μm.

The shape of the opening surface of the concavity 13 may be an arbitrary shape as described above. For example, the shape of the opening surface of the concavity 13 may be a circle, an ellipse, a rectangle, a polygon, etc. Further, the shape of the opening surface of the concavity 13 may be a shape including a curved line in a part of it. The area of the opening surface of the concavity 13 may not be fixed as long as the diameter of the opening surface satisfies the condition mentioned above.

The depth of the concavity 13 may be, for example, not less than 0.08 μm and not more than 30 μm, preferably 15 μm or less. In the case where the shape of the opening surface of the concavity 13 is substantially a rectangle or substantially a circle, the aspect ratio of the concavity 13 may be not less than 0.1 and not more than 10. Here, the aspect ratio of the concavity 13 is defined as a ratio in which the depth of the concavity 13 is divided by the minimum diameter or the length of the shortest side of the opening surface of the concavity 13.

When the depth of the concavity 13 is more than 30 μm or the aspect ratio of the concavity 13 is more than 10, the formation of the concavity 13 is difficult; thus, this is not preferable. When the depth of the concavity 13 is less than 0.08 μm or the aspect ratio of the concavity 13 is less than 0.1, the effect of emboss processing on the film main body 10 is reduced; thus, this is not preferable.

Here, in the case where the embossed film 1 is formed only of the film main body 10, the depth of the concavity 13 preferably does not exceed the thickness of the film main body 10. However, in the case where the embossed film 1 is formed as a stacked body of a support body and the film main body 10, the depth of the concavity 13 may exceed the thickness of the film main body 10 (that is, the concavity 13 may be formed to penetrate through the film main body 10).

The cross-sectional shapes of the concavities 13 are preferably substantially the same when the concavities 13 have the same opening shape and depth throughout the entire film main body 10. As an example, the shapes of the opening surfaces of the concavities 13 are preferably substantially the same throughout the entire film main body 10. When the cross-sectional shapes or the shapes of the opening surfaces of the concavities 13 are substantially the same, the grasp of the formation condition of the concavities 13 in the embossed film 1 is easier; thus, this is preferable.

At least part of the surface of the film main body 10 on which the convexity 11 and the concavity 13 are formed may be provided with a coating layer. Specifically, a coating layer may be provided on all of the upper surface of the convexity 11 of the film main body 10 and the side wall and bottom surface of the concavity 13, or a coating layer may be provided on part of the side wall and bottom surface of the concavity 13 of the film main body 10. However, the thickness of the coating layer may be substantially fixed in the entire surface regardless of the shape of the concavity 13. The coating layer may be a layer made of an inorganic compound, or may be a layer made of an organic compound such as a surface modifier, for example.

In the case where the coating layer is a layer made of an organic compound, the material of the coating layer is preferably different from the material of the film main body 10 on which the concavity 13 is formed. In such a case, the coating layer preferably has such a thickness as to be recognized as being deposited on part of the concavity 13, and specifically the volume of the deposited coating layer is preferably 30 volume % or less of the total volume of the space of the concavity 13.

The surface condition of the embossed film 1 can be stabilized more by forming such a coating layer. The coating layer may be formed such that the wall surface of the concavity 13 is inclined. In such a case, the transfer of a filler put in the concavity 13 can be made easier in an example of the use described later.

Next, an arrangement pattern of concavities 13 of the embossed film 1 according to the present embodiment is described with reference to FIG. 2 and FIG. 3. FIG. 2 is a top view showing an example of the arrangement pattern of concavities 13 of the embossed film 1 according to the present embodiment. FIG. 3 is a schematic diagram showing an example of the circular cylindrical master for forming the concavities 13 of the embossed film 1 shown in FIG. 2.

Figure 2:
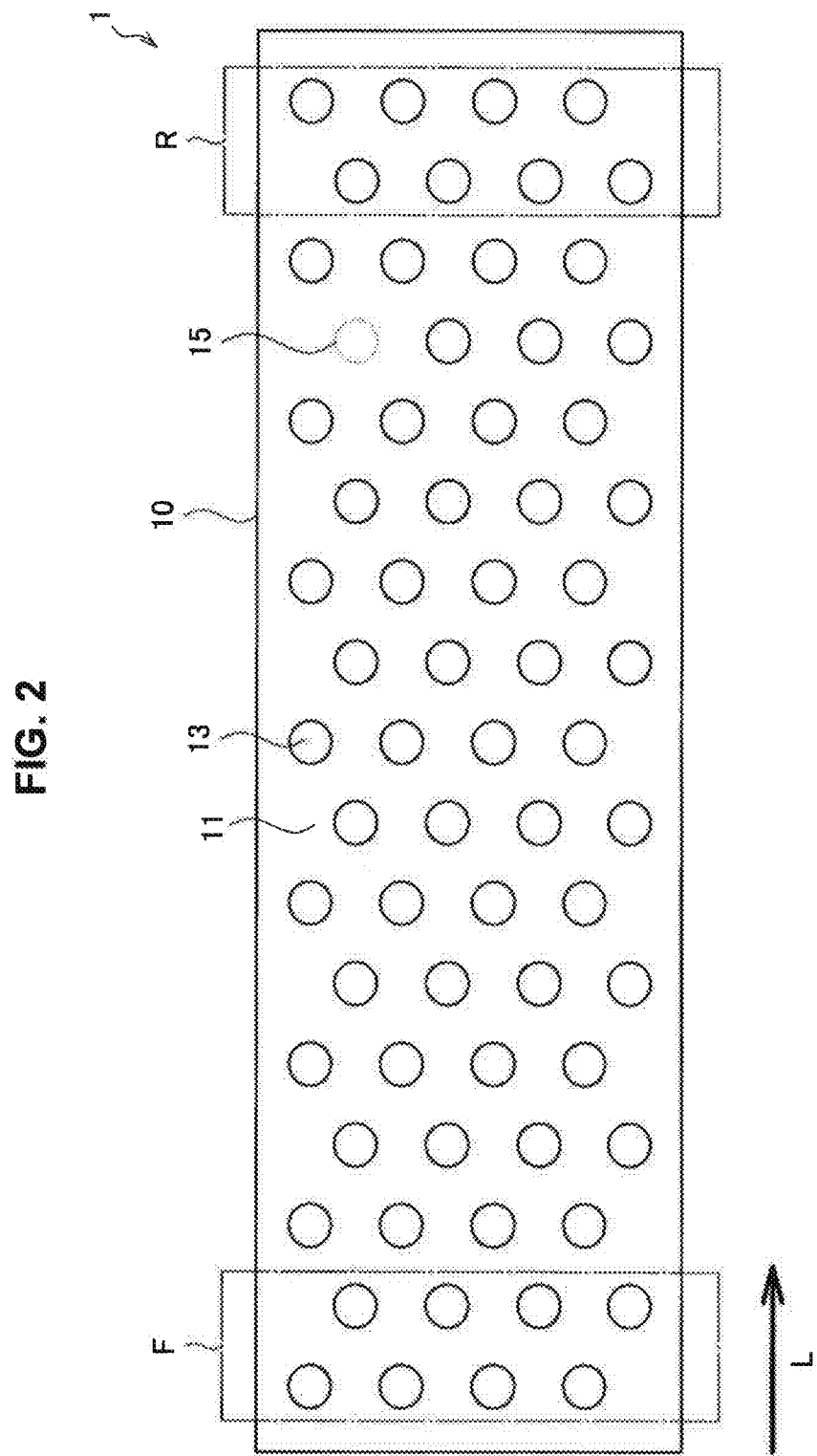
FIG. 2 is a top view showing an example of the arrangement pattern of concavities of the embossed film according to the embodiment.
Figure 3:
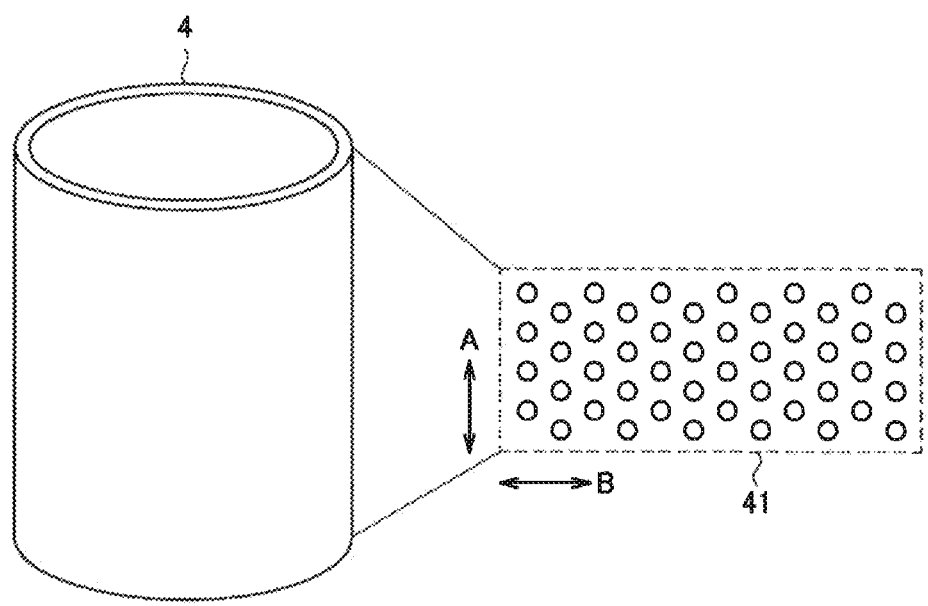
FIG. 3 is a schematic diagram showing an example of the circular cylindrical master for forming the concavities of the embossed film shown in FIG. 2.

As shown in FIG. 2, the film main body 10 is, for example, a long-length film. Specifically, the lower limit of the length of the film main body 10 may be any of 5 m, 10 m, 30 m, 50 m, 100 m, 200 m, 300 m, and 500 m. The width of the film main body 10 is not particularly limited, and is, for example, not less than 0.05 cm and not more than 300 cm.

The arrangement pattern of concavities 13 formed on the film main body 10 has periodicity along the length direction of the film main body 10. This is because, in the embossed film 1 according to the present embodiment, the convexities 11 and the concavities 13 are formed by pressing a circular cylindrical or circular columnar master against the film main body 10 by a roll-to-roll system. Hence, in the embossed film 1, the convexities 11 and the concavities 13 are formed in an arrangement pattern having at least periodicity corresponding to one round of the circular cylindrical or circular columnar master.

Specifically, FIG. 3 shows an example of a circular cylindrical master 4 for forming the concavities 13 of the embossed film 1 shown in FIG. 2. As shown in FIG. 3, a concave-convex structure 41 corresponding to the convexities 11 and the concavities 13 shown FIG. 2 is formed on the outer peripheral surface of the circular cylindrical master 4. Here, the A direction in the concave-convex structure 41 formed on the outer peripheral surface of the circular cylindrical master 4 is the width direction in the embossed film 1, and the B direction in the concave-convex structure 41 is the length direction in the embossed film 1.

As illustrated in FIG. 3, the concave-convex structure 41 may be an arrangement pattern having periodicity such as a hexagonal lattice, or may be an arbitrary arrangement pattern not having periodicity. However, since the circular cylindrical master 4 transfers the concave-convex structure 41 to the film main body 10 by pressing the film main body 10 while rotating, the arrangement pattern of convexities 11 and concavities 13 formed on the embossed film 1 necessarily has periodicity corresponding to one round of the circular cylindrical master 4.

The arrangement pattern of concavities 13 formed on the film main body 10 may have periodicity along a direction orthogonal to the length direction of the film main body 10 (that is, the width direction of the film main body 10). That is, concavities 13 of the same shape may be formed repeatedly along the width direction of the film main body 10. The arrangement pattern of concavities 13 may have the same repeating period in both the length direction and the width direction of the film main body 10. This is because, when the embossed film 1 formed is cut to form a sheet film in a sheet form, substantially the same pattern can be obtained in both the length direction and the width direction.

Here, in general, in the embossed film 1 produced by transfer from a pattern master, there has been a case where a lost portion 15 due to a transfer defect occurs when the film main body 10 is pressed from the pattern master. The lost portion 15 refers to, for example, a portion in which the concavity 13 is not formed in a position where the concavity 13 is supposed to be formed in the arrangement pattern to be transferred. Such a lost portion 15 occurs by the wearing-out of the convex structure, resin clogging to the concave structure, etc. due to the continuous use of the pattern master. Hence, there has been a tendency in which, as the area with which the transfer of the concave-convex structure to the film main body 10 is performed becomes larger, the number of lost portions 15 increases cumulatively.

In the embossed film 1 according to the present embodiment, the difference between the rate of loss of concavities 13 in one end portion of the film main body 10 and the rate of loss of concavities 13 in the other end portion of the film main body 10 is 10 ppm or less. The rate of loss refers to the proportion of the lost portions 15 to all the concavities 13 in a prescribed area. Thereby, in the embossed film 1 according to the present embodiment, the uniformity of the concave-convex structure is improved in a large-area film main body 10, and the frequency of occurrence of lost portions 15 is reduced. The lower limit value of the difference between the rate of loss of concavities 13 in one end portion of the film main body 10 and the rate of loss of concavities 13 in the other end portion of the film main body 10 is not particularly limited, but is preferably as small as possible and is most preferably 0, as a matter of course.

More specifically, in the case where concavities 13 are formed on the film main body 10 in the direction of arrow L, the difference between the rate of loss of concavities 13 in area F that is one end portion of the film main body 10 and the rate of loss of concavities 13 in area R that is the other end portion of the film main body 10 is 10 ppm or less. Here, since the arrangement pattern of concavities 13 has periodicity along the length direction of the film main body 10, an area in which concavities 13 of the same arrangement pattern are formed in one period of the arrangement pattern is selected as area F and area R. That is, the rate of loss of concavities 13 formed on the film main body 10 is compared between areas in which the arrangement pattern of concavities 13 is the same.

In the embossed film 1 according to the present embodiment, the occurrence of consecutive lost portions 15 in the length direction of the film main body 10 (more specifically, the direction in which concavities 13 are formed, i.e., the direction of arrow L) is suppressed. Specifically, the embossed film 1 can reduce the number of consecutive lost portions 15 in the range of 10 cm$^2$ of the film main body 10 to 10 or less, preferably 5 or less. Here, the consecutive lost portions 15 refer to an event in which adjacent concavities 13 are not pattern-formed but have become lost portions 15. The lower limit value of the number of consecutive lost portions 15 in the range of 10 cm$^2$ of the film main body 10 is not particularly limited, but is preferably as small as possible and is most preferably 0, as a matter of course.

The arrangement pattern of concavities 13 is not particularly limited, and may be an arbitrary arrangement pattern. However, the number density of concavities 13 is preferably 50,000,000/cm$^2$ or less. When the number density of concavities 13 is more than 50,000,000/cm$^2$, the contact area between the circular cylindrical or circular columnar master and the film main body 10 is increased at the time of forming the concavities 13 and the releasability between the master and the film main body 10 is reduced, and it is difficult for the concavities 13 to be formed; thus, this is not preferable. The lower limit value of the number density of concavities 13 is not particularly limited, and may be, for example, 100/cm$^2$ or more.

The interval between concavities 13 (that is, the pitch of the concavities 13 of the arrangement pattern) may be, for example, not less than 0.5 μm and not more than 1000 μm. The interval between concavities 13 refers to the distance between the centers of the opening surfaces of adjacent concavities 13.

Here, the shape and arrangement pattern of the opening surface of the concavity 13 may be various forms, and examples include lattice forms such as a square lattice, an orthorhombic lattice, a hexagonal lattice, and a parallel body lattice. The shape of the opening surface of the concavity 13 may be a circle, a rectangle, or a shape including a curved line. The arrangement pattern of concavities 13 may be any arrangement pattern as long as it has periodicity, and may be, for example, a pattern in which a plurality of arrangement patterns coexist. In the case where a plurality of arrangement patterns coexist, the number density of concavities 13 is preferably 50,000,000/cm$^2$ or less for the total number of concavities 13 of the arrangement patterns.

Convexities 11 having the shape and arrangement pattern of the concavities 13 described above may be formed in place of the concavities 13 described above. That is, convexities 11 having the inversion shape of the arrangement pattern of concavities 13 described above may be formed, and convexities 11 may be formed in a lattice form such as a square lattice, an orthorhombic lattice, a hexagonal lattice, or a parallel body lattice, for example. In such a case, the rate of loss described later is preferably calculated using the presence or absence of loss of convexities 11.

In the embossed film 1, it is possible for a seam or a joint derived from the pattern master to be present. This is because such a seam or a joint has limited influence on the embossed film 1 when it is in a minute range. For example, when such a seam or a joint is a line or the like formed by a situation in which concavities or convexities having a size of not more than visible light wavelengths are interspersed, the influence on the embossed film 1 can be made small. In addition, this is because, in the case where the embossed film 1 is a long-length film, such a seam or a joint can be used to identify the coordinates in the embossed film 1.

As described above, in the embossed film 1 according to the present embodiment, the difference between the rate of loss of concavities 13 in one end portion of the film main body 10 and the rate of loss of concavities 13 in the other end portion of the film main body 10 is 10 ppm or less. That is, in the embossed film 1 according to the present embodiment, the damage to the convex structure or the concave structure on the occasion when the circular cylindrical or circular columnar master is continuously used for transfer is small. Hence, even when concavities 13 are formed on a large-area film main body 10, the cumulative increased amount of lost portions 15 in the embossed film 1 can be suppressed.

Therefore, the embossed film 1 according to the present embodiment can improve the uniformity of the concave-convex structure in a large-area film main body 10, and can reduce the frequency of occurrence of lost portions 15.

The embossed film 1 according to the present embodiment described above may be cut with a prescribed length to produce sheet films. Since these sheet films are produced from the embossed film 1 in which the uniformity of the concave-convex structure is high in the entire film, the uniformity of the concave-convex structure in the sheet film and between sheet films can be improved.

Also a structure in which a plurality of embossed films 1 according to the present embodiment described above and a plurality of sheet films produced by cutting the embossed film 1 are stacked is included in the scope of the present invention.

1.2. Examples of Use of Embossed Film

Figure 4:
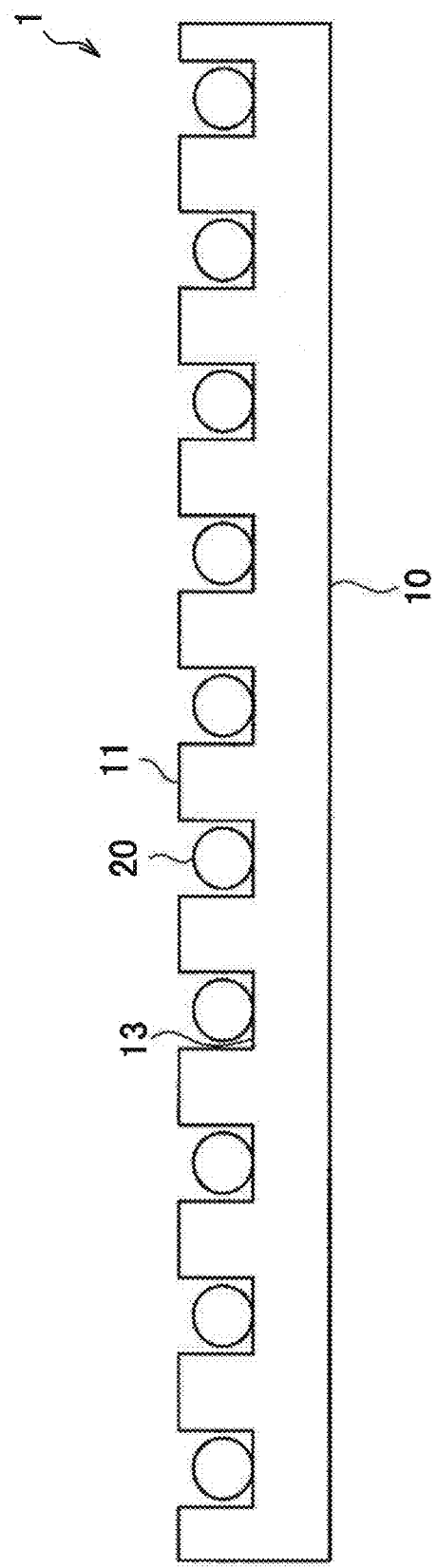
FIG. 4 is an explanatory diagram for describing an example of the use of the embossed film according to the embodiment.

Next, an example of the use of the embossed film 1 according to the present embodiment is described with reference to FIG. 4 to FIG. 5B. FIG. 4 is an explanatory diagram for describing an example of the use of the embossed film 1 according to the present embodiment.

The embossed film 1 according to the present embodiment can be used as a transfer film at the time of arranging minute solid bodies such as fillers in a prescribed arrangement pattern on a resin sheet or the like.

Specifically, as shown in FIG. 4, the concavity 13 of the embossed film 1 is filled with a filler 20. Next, the surface of the embossed film 1 filled with the filler 20 is pressed against a transfer sheet 30, and thereby the filler 20 can be transferred to the transfer sheet 30 side.

By thus transferring the filler 20 using the embossed film 1, minute fillers can be easily arranged on the surface of the transfer sheet 30 in accordance with the arrangement pattern of concavities 13 formed on the embossed film 1.

Examples of the method for putting the filler 20 into the concavity 13 of the embossed film 1 include a method in which fillers 20 are scattered on the embossed film 1 and then the surface of the embossed film 1 is wiped with a fiber body (e.g., cloth etc.), and the like. Here, the size of the texture or stitches of the fiber body used for wiping is preferably finer than the diameter of the filler 20.

As the filler 20 to be put in the concavity 13 of the embossed film 1, an inorganic substance, an organic substance, a material in which an inorganic substance has a multiple-layer structure, a material in which an inorganic substance and an organic substance coexist (for example, a material in which a minute solid body made of an organic substance is coated with an inorganic substance), and the like may be used. Specifically, the filler 20 may be a pigment, a dye, or the like. The specific gravity of the filler 20 (water is used as the reference) may be, for example, not less than 0.8 and not more than 23. The filler 20 may be provided with various properties or various types of functionality.

The shape of the filler 20 may be any shape, but is preferably a shape having approximate isotropy or a shape obtained by pulverizing a crystalline substance. The size of the filler 20 may be any size as long as it can be put into the concavity 13 of the embossed film 1. However, it is preferable that the maximum length of the line segment connecting any two points of the outline of the filler 20 be not more than the minimum length of the line segment connecting any two points on the outline of the opening surface of the concavity 13.

Here, the concavities 13 of the embossed film 1 may not be filled with the same filler 20. Specifically, a plurality of types of fillers 20 of different shapes or materials may be put individually in the concavities 13 of the embossed film 1. By using the embossed film 1 like this, a plurality of types of fillers 20 can be arranged on the surface of the transfer sheet 30 simultaneously.

As described above, a coating layer made of an inorganic compound or the like may be formed on part of the surface of the convexity 11 and the concavity 13 of the embossed film 1. In the case where a coating layer is formed on part of the surface of the convexity 11 and the concavity 13, the releasability between the concavity 13 of the embossed film 1 and the filler 20 can be improved, and therefore the transferability of the filler 20 to the transfer sheet 30 can be improved.

Figure 5A:
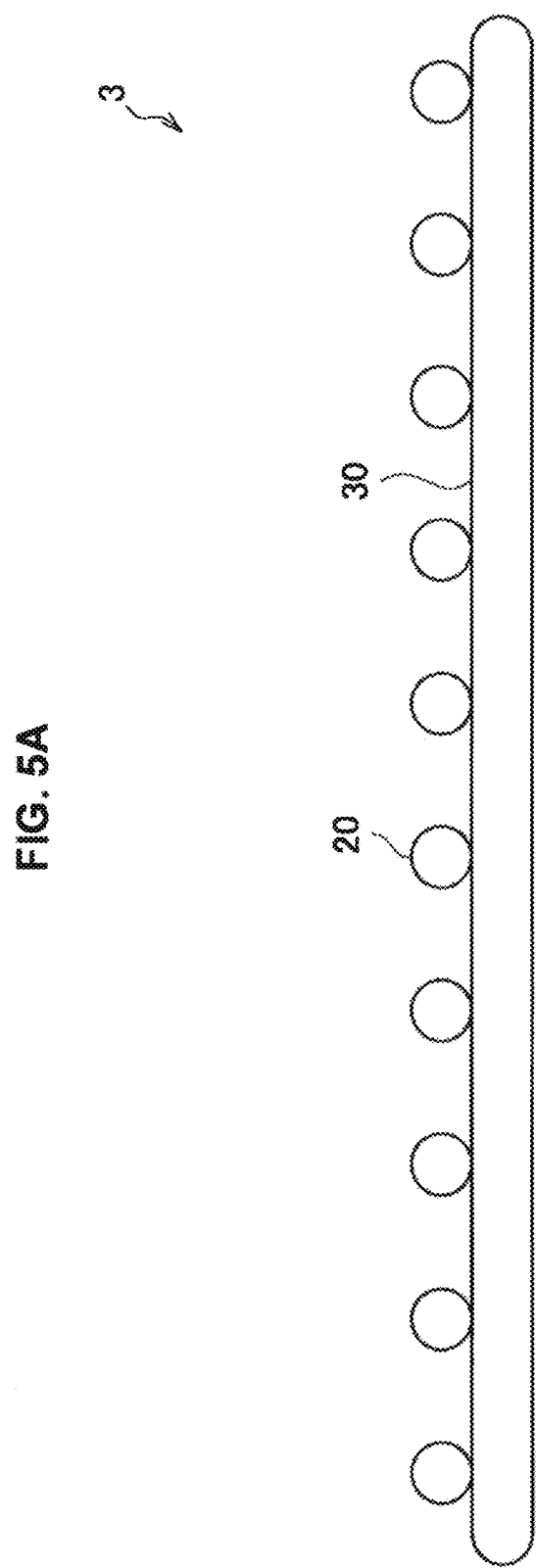
FIG. 5A is a cross-sectional view schematically showing a cross-sectional shape of a transfer copy using the embossed film according to the embodiment taken along the thickness direction.
Figure 5B:
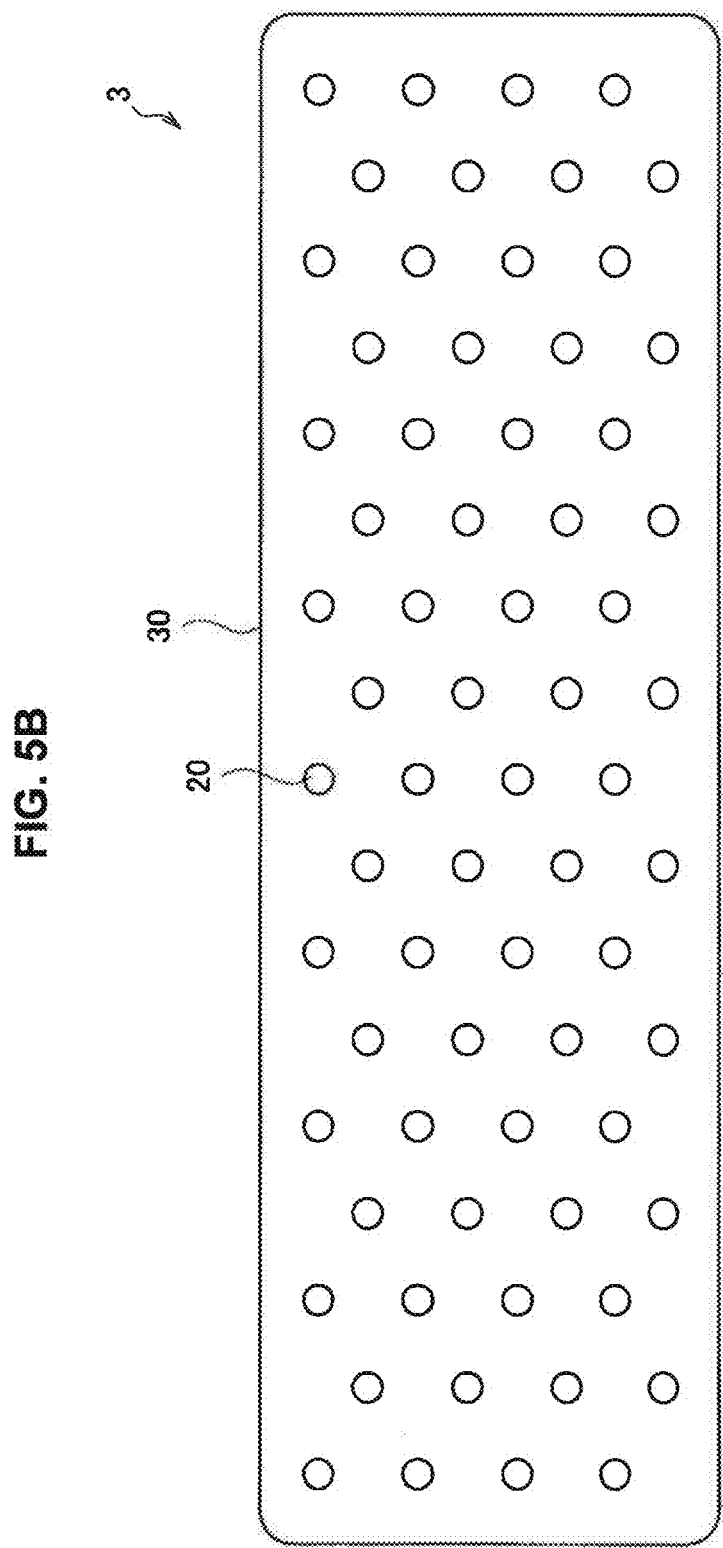
FIG. 5B is a top view showing the planar state of the transfer copy using the embossed film according to the embodiment.

The transfer sheet 30 thus produced, which is a transfer copy, is shown in FIG. 5A and FIG. 5B. FIG. 5A is a cross-sectional view schematically showing a cross-sectional shape of a transfer copy using the embossed film 1 according to the present embodiment taken along the thickness direction, and FIG. 5B is a top view showing the planar state of the transfer copy using the embossed film 1 according to the present embodiment.

The material of the transfer sheet 30 is not particularly limited, but the transfer sheet 30 is preferably a sticky sheet, for example. In the case where the transfer sheet 30 has stickiness, the transferability of the filler 20 put in the embossed film 1 can be improved.

When the filler 20 is transferred to the transfer sheet 30 using the embossed film 1 according to the present embodiment, the rate of transfer of fillers 20 to the transfer sheet 30 can be made 99.99% or more (that is, the rate of loss can be made 100 ppm or less). Here, the rate of transfer refers to a proportion in which the number of fillers 20 transferred to the surface of the transfer sheet 30 is divided by the number of concavities 13 formed on the embossed film 1 (in practice, including the lost portion 15 in which the concavity 13 is not formed).

In the above, an example of the use of the embossed film 1 according to the present embodiment is described. The example of the use of the embossed film 1 according to the present embodiment is not limited to the example mentioned above. For example, the embossed film 1 according to the present embodiment may also be used as heat insulating or heat dissipating members, flatting films, anti-sticking films, etc. that are known as examples of the use of an embossed film. Further, the embossed film 1 according to the present embodiment may also be used for printed electronics.

The filler 20 transferred using the embossed film 1 according to the present embodiment may also be used for the surface modification of vehicles etc. (glazing etc.), for example. The use of the filler 20 transferred using the embossed film 1 according to the present embodiment and the transfer destination body including the transferred filler 20 is not particularly limited, and examples include the printed electronics field and fields of application thereof (including related fields), etc. The transferred filler 20 and the transfer destination body including the transferred filler 20 may be used not only in the fields mentioned but also as a functional film (or a functional device). For example, the transferred filler 20 and the transfer destination body including the transferred filler 20 may be used as a biosensor, a diagnostic device, or the like in the fields of medical treatment, bioscience, health care, and life science, or may be used as an optical element. Further, the transferred filler 20 and the transfer destination body including the transferred filler 20 may also be used in battery-related or energy-related fields and vehicle-related fields (that is, the automotive field).

Further, the filler 20 may be transferred to another film using the embossed film 1 according to the present embodiment, and the other film to which the filler 20 is transferred may be further stacked on another film. Also a configuration in which part or all of the fillers 20 are provided in prescribed positions of another film by thus repeating transfer and stacking is included in the scope of the present invention.

1.3. Method for Producing Embossed Film

Next, a method for producing the embossed film 1 according to the present embodiment is described with reference to FIG. 6 and FIG. 7. The embossed film 1 according to the present embodiment can be produced by, for example, applying a transfer layer 62 made of a photocurable resin (corresponding to the film main body 10) onto a base material 61 that is a support body and pressing a master 4 against the transfer layer 62 to form concavities 13 on the transfer layer 62.

Figure 6:
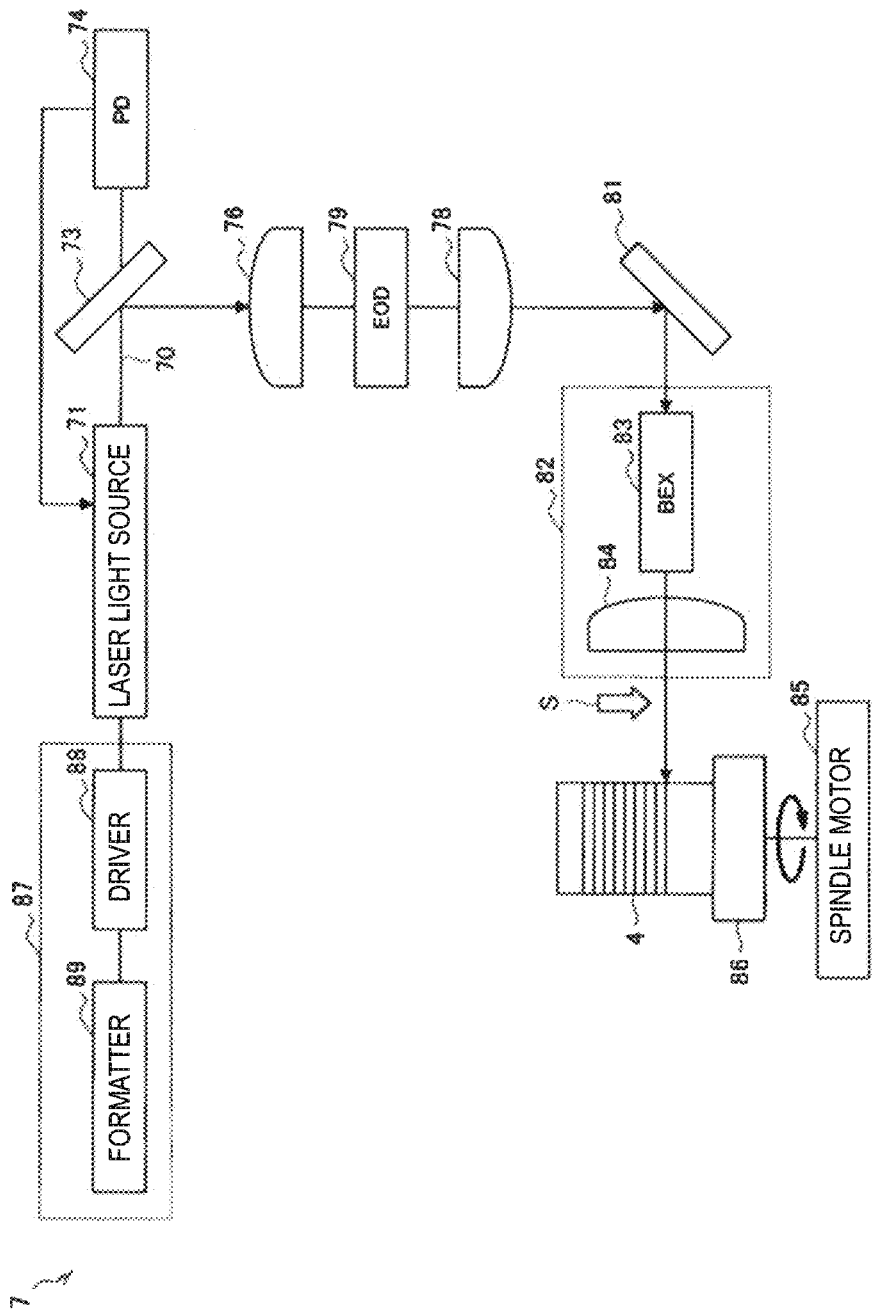
FIG. 6 is an explanatory diagram showing the configuration of an exposure apparatus that draws an arbitrary pattern on a master used in the embodiment.

A concave-convex structure 41 having an arbitrary arrangement pattern can be formed on the master 4 that is to be transferred to the embossed film 1 according to the present embodiment by, for example, using an exposure apparatus 7 shown in FIG. 6.

Specifically, a master 4 with a resist layer formed on its outer peripheral surface is irradiated with laser light by the exposure apparatus 7, and thus the resist layer in positions corresponding to an arbitrary arrangement pattern is exposed to light. Next, the light-exposed resist layer is developed, and then etching or the like is performed on the master 4 on which a resist pattern corresponding to the arbitrary arrangement pattern is formed; thus, a concave-convex structure 41 having an arbitrary arrangement pattern can be formed on the master 4.

The configuration of an exposure apparatus that can draw an arbitrary pattern on the master 4 will now be described. FIG. 6 is an explanatory diagram showing the configuration of an exposure apparatus 7 that draws an arbitrary pattern on the master 4 used in the present embodiment.

As shown in FIG. 6, the exposure apparatus 7 includes a laser light source 71, a first mirror 73, a photodiode (PD) 74, a light collecting lens 76, an electro-optical deflection element (electro-optic deflector, EOD) 79, a collimator lens 78, a control mechanism 87, a second mirror 81, a movable optical table 82, a spindle motor 85, and a turntable 86. The master 4 is mounted on the turntable 86, and is rotatable.

The laser light source 71 is, for example, a semiconductor laser. Specifically, the laser light source 71 may be a blue semiconductor laser that emits laser light of a blue light wavelength of 400 nm to 500 nm. The spot diameter of the laser light 70 emitted by the laser light source 71 may be, for example, approximately 200 nm.

The laser light 70 emitted from the laser light source 71 goes straight while remaining a parallel beam, and is reflected at the first mirror 73. The laser light 70 reflected at the first mirror 73 is collected to the electro-optical deflection element 79 by the light collecting lens 76, and is then made into a parallel beam again by the collimator lens 78. The laser light 70 made into a parallel beam is reflected by the second mirror 81, and is guided onto the movable optical table 82 horizontally and parallel.

The first mirror 73 is formed of a polarizing beam splitter, and has the function of reflecting one polarized component and transmitting the other polarized component. The polarized component transmitted through the first mirror 73 is received by the photodiode 74, and is photoelectrically converted. A light receiving signal photoelectrically converted by the photodiode 74 is inputted to the laser light source 71, and the laser light source 71 modulates the laser light 70 on the basis of the inputted light receiving signal.

The electro-optical deflection element 79 is an element capable of controlling the irradiation position of laser light 70. By means of the electro-optical deflection element 79, the exposure apparatus 7 can also change the irradiation position of laser light 70 guided onto the movable optical table 82.

The control mechanism 87 includes a formatter 89 and a driver 88, and controls the application of laser light 70.

The formatter 89 generates a control signal for applying laser light 70 to the master 4 on the basis of an input image in which an arbitrary pattern to be drawn on the master 4 is drawn. Specifically, first, the formatter 89 acquires an input image in which an arbitrary pattern to be drawn on the master 4 is drawn. The input image is an image corresponding to a development view of the outer peripheral surface of the master 4 in which the outer peripheral surface of the master 4 is cut open in the axial direction and is spread in one plane. Next, the formatter 89 divides the input image into small areas of a prescribed size (for example, divides into a lattice form), and assesses whether the drawing pattern is included in each small area or not. Subsequently, the formatter 89 generates a control signal that makes control so that laser light 70 is applied to each small area assessed as the drawing pattern being included. The driver 88 controls the power of the laser light source 71 on the basis of the control signal generated by the formatter 89. Thereby, the application of laser light 70 to the master 4 is controlled.

The movable optical table 82 includes a beam expander (BEX) 83 and an objective lens 84. The laser light 70 guided to the movable optical table 82 is shaped into a desired beam shape by the beam expander 83, and is then applied to the outer peripheral surface of the master 4 via the objective lens 84.

By the configuration of these components, the master 4 is rotated at a constant speed on the turntable 86, and laser light 70 is applied while being scanned at a constant speed in the axial direction of the master 4; thus, drawing is performed on the master 4. The scanning of laser light 70 is performed by using the movable optical table 82 to move the laser light 70 at a constant speed in the direction of arrow S.

A concave-convex structure 41 having an arbitrary arrangement pattern can be formed on the master 4 also by using other methods. For example, a concave-convex structure 41 having an arbitrary arrangement pattern can be formed on the outer peripheral surface of the master 4 also by using ultraprecision cutting with a single-crystal diamond tool or the like.

Next, a method in which the master 4 produced by the method mentioned above or the like is pressed against the film main body 10 to form the embossed film 1 is described. FIG. 7 is an explanatory diagram showing the configuration of a transfer apparatus that produces the embossed film 1 according to the present embodiment.

Figure 7:
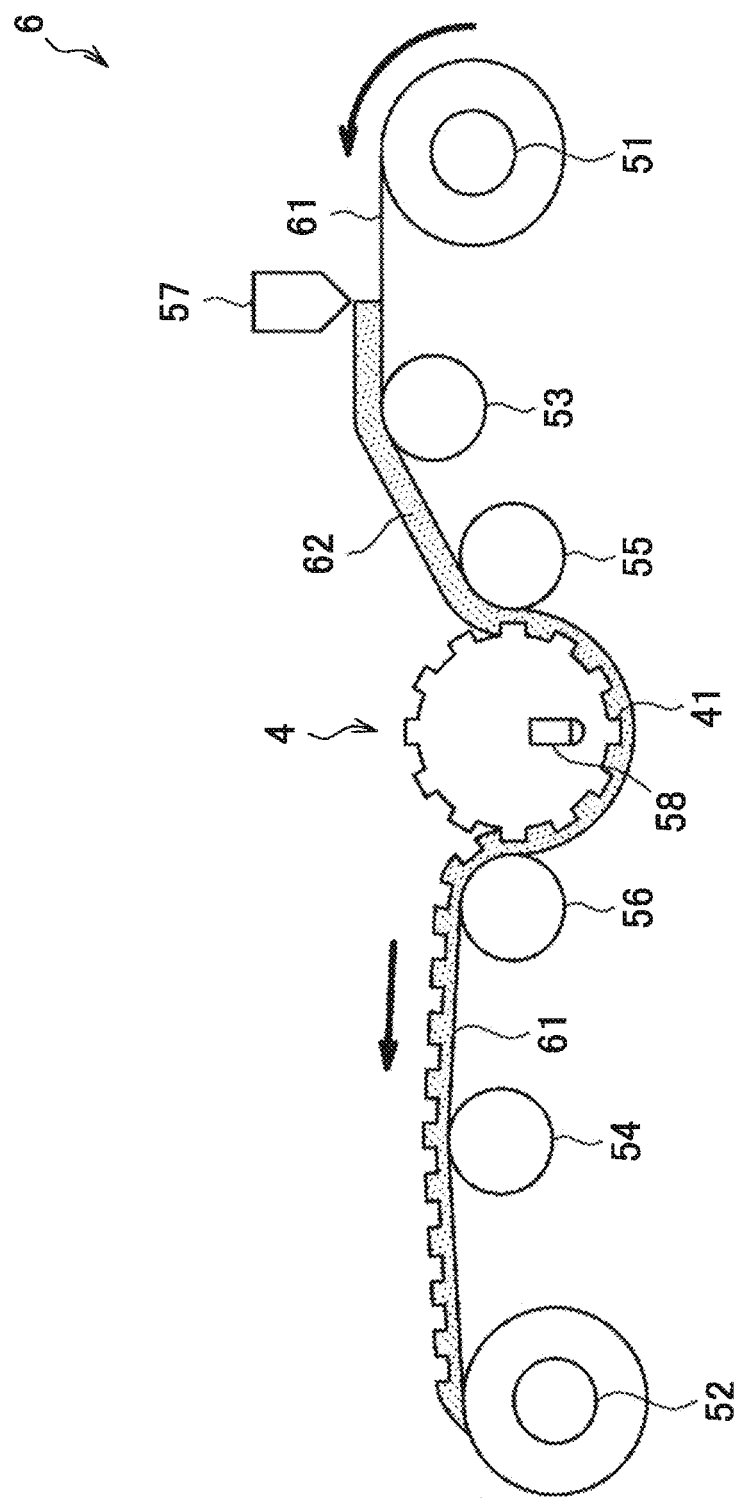
FIG. 7 is an explanatory diagram schematically showing a transfer apparatus that produces an embossed film according to the embodiment.

As shown in FIG. 7, a transfer apparatus 6 includes the master 4, a base material supply roll 51, a winding roll 52, guide rolls 53 and 54, a nip roll 55, a peeling roll 56, a coating apparatus 57, and a light source 58.

The master 4 is a circular cylindrical or circular columnar master in which a concave-convex structure 41 having an arbitrary arrangement pattern is formed on the outer peripheral surface. The material of the master 4 is not particularly limited, and quartz glass ($SiO_2$) such as fused quartz glass or synthetic quartz glass, or stainless steel or the like may be used. The size of the master 4 is not particularly limited; for example, the axial length may be 100 mm or more, the outer diameter may be not less than 50 mm and not more than 300 mm, and the thickness may be not less than 2 mm and not more than 50 mm.

A concave-convex structure 41 that is the inverted shape of convexities 11 and concavities 13 to be formed on the embossed film 1 is formed on the outer peripheral surface of the master 4. Here, the concave-convex structure 41 formed on the outer peripheral surface of the master 4 may be an arbitrary shape. It is possible for a seam or a joint resulting from production to be formed on the outer peripheral surface of the master 4. Such a seam or a joint, if it is in a minute range, has limited influence on the embossed film 1, and can be used as a sign for identifying the coordinates in the embossed film 1.

The base material supply roll 51 is a roll around which the base material 61 that is a sheet-form support body is wound in a roll form, and the winding roll 52 is a roll that winds the embossed film 1 in which the concave-convex structure 41 is transferred to the transfer layer 62. The guide rolls 53 and 54 are rolls that convey the base material 61. The nip roll 55 is a roll that presses the base material 61 on which the transfer layer 62 is stacked against the master 4, and the peeling roll 56 is a roll that, after the concave-convex structure 41 is transferred to the transfer layer 62, peels off the embossed film 1 to which the concave-convex structure 41 is transferred (that is, the base material 61 on which the transfer layer 62 is stacked) from the master 4.

The coating apparatus 57 includes a coating means such as a coater, and applies a photocurable resin composition to the base material 61 to form the transfer layer 62. The coating apparatus 57 may be, for example, a gravure coater, a wire bar coater, a die coater, or the like. The light source 58 is a light source that emits light of a wavelength capable of curing the photocurable resin composition, and may be, for example, an ultraviolet lamp or the like.

In the case where the light source 58 is a directional light source, the light irradiation angle may be inclined from the direction perpendicular to the transfer layer 62. In such a case, a difference occurs in the curing rate of the surface of the concave-convex structure formed on the transfer layer 62, and the surface is cured partially; thus, the rate of transfer of the embossed film 1 can be improved.

The photocurable resin composition is a resin that decreases in fluidity and cures by being irradiated with light of a prescribed wavelength. Specifically, the photocurable resin composition may be an ultraviolet curable resin such as an acrylic resin. The photocurable resin composition may contain an initiator, a filler, a functional additive, a solvent, an inorganic material, a pigment, an antistatic agent, a sensitizing dye, etc., as necessary.

In the transfer apparatus 6, first, the base material 61 is continuously fed from the base material supply roll 51 via the guide roll 53. The photocurable resin composition is applied to the fed base material 61 by the coating apparatus 57, and thus the transfer layer 62 is stacked on the base material 61. The base material 61 on which the transfer layer 62 is stacked is stuck to the master 4 by the nip roll 55. Thereby, the concave-convex structure 41 formed on the outer peripheral surface of the master 4 is transferred to the transfer layer 62. After the concave-convex structure 41 is transferred, the transfer layer 62 is cured by being irradiated with light from the light source 58. Subsequently, the base material 61 on which the cured transfer layer 62 is stacked (i.e., the embossed film 1) is peeled off from the master 4 by the peeling roll 56, and is wound by the winding roll 52 via the guide roll 54.

The embossed film 1 according to the present embodiment can be continuously produced by the transfer apparatus 6 like this. In the transfer apparatus 6 mentioned above, the base material 61 may be switched to another lot on the way in order to perform transfer continuously.

Figure 8A:
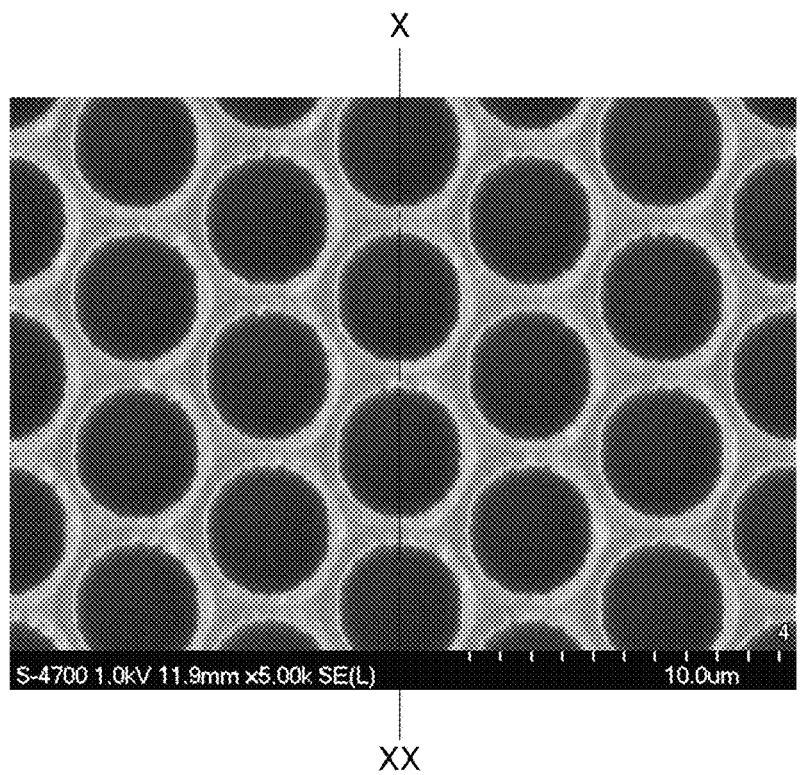
FIG. 8A is an observation image of an embossed film according to the embodiment observed with a SEM.
Figure 8B:
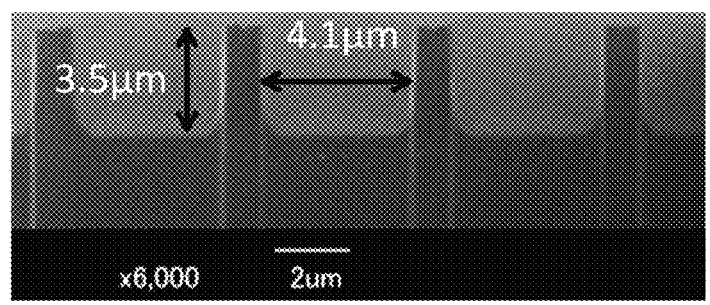
FIG. 8B is an observation image of an embossed film according to the embodiment observed with a SEM.
Figure 9A:
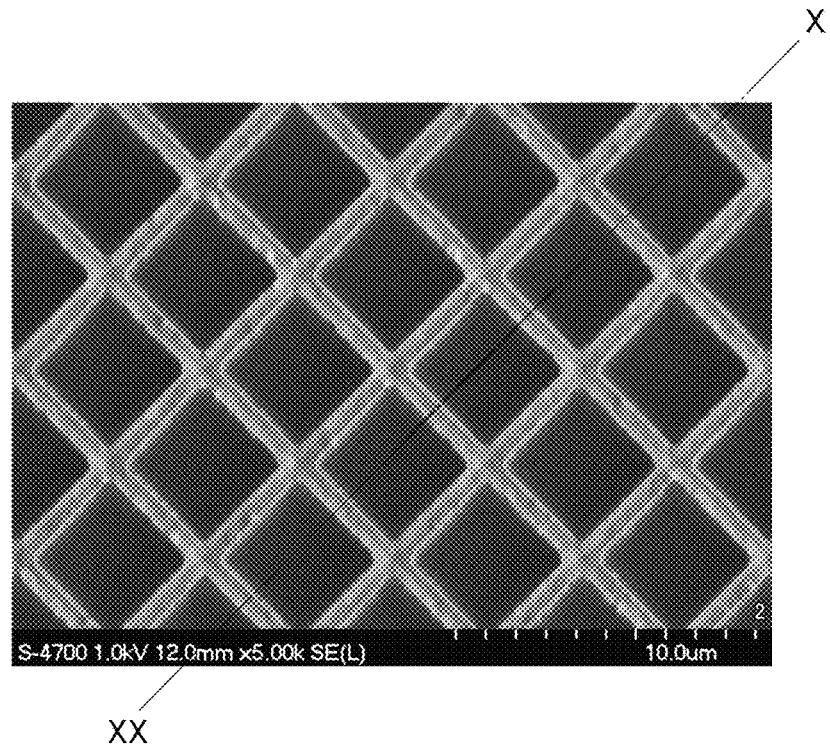
FIG. 9A is an observation image of an embossed film according to the embodiment observed with a SEM.
Figure 9B:
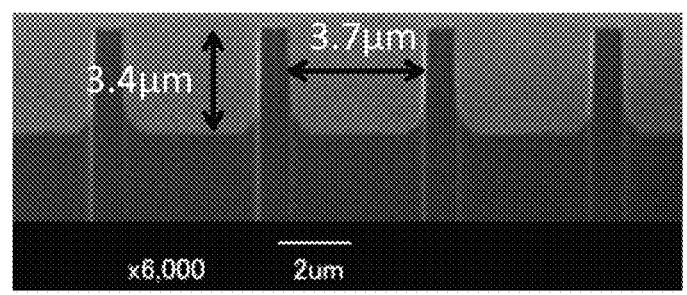
FIG. 9B is an observation image of an embossed film according to the embodiment observed with a SEM.

FIGS. 8A and 8B, FIGS. 9A and 9B show images of examples of the embossed film 1 produced in this way. FIGS. 8A and 8B, FIGS. 9A and 9B are observation images of embossed films 1 according to the present embodiment observed with a scanning electron microscope (SEM). FIG. 8A and FIG. 9A are SEM images in which the upper surface of the embossed film 1 is observed, and FIG. 8B and FIG. 9B are SEM images in which a cross section of the embossed film 1 shown in FIG. 8A and FIG. 9A taken along line X-XX is observed. In FIG. 8A and FIG. 9A, the vertical direction of the SEM image corresponds to the length direction of the embossed film 1, and the left and right direction corresponds to the width direction of the embossed film 1.

Referring to FIG. 8A and FIG. 9A, it can be seen that the embossed films 1 according to the present embodiment can form a concave-convex structure having an arbitrary arrangement pattern. Referring to FIG. 8B and FIG. 9B, it can be seen that the depth of the formed concave-convex structure is approximately 3.4 μm to 3.5 μm.

2. Examples

The embossed film according to the present embodiment will now be described more specifically with reference to Example and Comparative Example. Example shown below is an example of the conditions for showing the feasibility and effect of the embossed film according to the present embodiment, and the present invention is not limited to Example below.

Example

An embossed film according to Example was produced by the following steps.

First, a circular cylindrical master was produced. Specifically, using chemical vapor deposition (CVD) with a hydrocarbon-based gas, diamond-like carbon (DLC) was formed as an intermediate layer with a film thickness of 800 nm on the outer peripheral surface of a circular cylindrical material made of quartz glass with a thickness of 4.5 mm. Next, using the sputtering method, a tungsten oxide was formed as a resist layer with a film thickness of 55 nm on the intermediate layer.

Subsequently, thermal lithography based on laser light was performed by the exposure apparatus shown in FIG. 6, and thus a latent image was formed on the resist layer. A blue semiconductor laser that emits laser light of a wavelength of 405 nm was used as the laser light source of the exposure apparatus. An arrangement pattern in which circles with a diameter of 7 μm were arranged in a hexagonal lattice form with a pitch of 10 μm (the distance between the centers of circles) was used as the light exposure pattern. The portions other than the circles with a diameter of 7 μm were exposed to light by the exposure apparatus so that the circle with a diameter of 7 μm might be a convexity on the master (that is, so that the circle with a diameter of 7 μm might be a concavity in the embossed film after transfer).

Subsequently, the material in which the resist layer was exposed to light was developed using a 2.38 mass % tetramethylammonium hydroxide (TMAH) aqueous solution, and the resist of the light-exposed portion was dissolved.

Further, using the resist layer after development as a mask, the intermediate layer was etched by reactive ion etching with $O_2$ gas. Subsequently, using the resist layer and the intermediate layer as a mask, the material was etched by reactive ion etching with a CF-based gas. The etching of the material was performed until the height of the convexity became 7 μm so that the aspect ratio of the concavity in the embossed film might be 1. By the above steps, a circular cylindrical master in which a concave-convex structure was formed on the outer peripheral surface was produced.

Subsequently, a photocurable resin composition containing 100 parts by mass of an acrylate resin of M208 (produced by Toagosei Co., Ltd.) and 2 parts by mass of a photopolymerization initiator of IRGCUR 184 (produced by BASF SE) was applied with a film thickness of 30 μm to a base material film made of PET with a width of 50 cm (film thickness: 50 μm). Then, the master was pressed against the base material film using the transfer apparatus shown in FIG. 7 above, and light irradiation of 1000 mJ was performed with a high-pressure mercury lamp; thus, the concave-convex structure was transferred to 1000 m of the base material film. Thereby, an embossed film in which circular concavities with a diameter of 7 μm and a depth of 7 μm (the aspect ratio: 1) were arranged in a hexagonal lattice form with a distance between the centers of concavities of 10 μm was produced. 100 places of a 1 mm$^2$ area were observed for measurement using an optical microscope, and it was found that the number density of concavities of the embossed film was 11,500/mm$^2$.

Subsequently, the rate of loss of concavities of the embossed film according to Example produced by the above method was evaluated. Specifically, a plurality of places were observed at prescribed distances from the transfer start position using an optical microscope until a surface field of view of 200 μm×200 μm was magnified to 25 cm$^2$, and the proportion of the lost portions 15 to all the concavities 13 in the observed area was calculated. Such evaluation of the rate of loss was performed in the range of transfer distances of 1 m to 1000 m on the assumption that the start position of transfer from the master was 0. Table 1 below shows the calculated rates of loss.

TABLE 1

| Distance from transfer start position (m) | Rate of loss (ppm) |
|---|---|
| 1 | 0 |
| 250 | 0.1 |
| 500 | 0.4 |
| 750 | 0.8 |
| 1000 | 1 |

As can be seen from the results shown in Table 1, it has been found that, in the embossed film according to Example, the difference between the rate of loss of concavities in one end portion of the film (a position at a distance from the transfer start position of 1 m) and the rate of loss of concavities in the other end portion of the film (a position at a distance from the transfer start position of 1000 m) is 1 ppm or less. Therefore, it can be seen that, when the length of the embossed film is 1000 m, the rates of loss calculated at points at intervals of 25%, i.e., 0.1%, 25%, 50%, 75%, and 100%, from a position of 0.1% of the length of the entire film (that is, a position at a distance from the transfer start position of 1 m) to a position of 100% of the length of the entire film (that is, a position at a distance from the transfer start position of 1000 m) almost coincide in the embossed film according to Example.

Although not shown in Table 1, the values at distances from the transfer start position of 100 m and 200 m were close to the value at a distance from the transfer start position of 1 m. Further, although not shown in Table 1, the value at a distance from the transfer start position of 300 m was close to the value at a distance from the transfer start position of 250 m. Further, also between 500 m and 750 m, numerical values within the range between the rates of loss at 500 m and 750 m were shown. The same applies to between 750 m and 1000 m.

Further, the embossed film according to Example was filled with resin fillers, and the resin fillers were transferred to a transfer sheet. As the resin filler, EPOSTAR MA1006 (produced by Nippon Shokubai Co., Ltd), which is a methyl polymethacrylate-based cross-linked product, was used after it was classified so that the average particle diameter might be 5 μm, using an image particle size analyzer of FPIA 3000 (manufactured by Malvern Instruments Ltd.).

Parts of the embossed film at distances from the transfer start position of 1 m, 30 m, and 150 m were extracted, the resin fillers mentioned above were put in by wiping with a fiber body, and the resin fillers were transferred to a transfer sheet that was made of 60 parts by mass of a phenoxy resin of YP-50 (produced by Nippon Steel Chemical Co., Ltd.) and 40 parts by mass of an epoxy resin of jER 828 (produced by Mitsubishi Chemical Corporation) and that exhibited stickiness (the temperature during transfer was set to 60° C. and the pressure was set to 2 MPa).

In a similar manner to the above, transfer defects of the transferred resin fillers (that is, places where the resin filler was not transferred) were observed with an optical microscope. As a result, it was found that, in each of the transfer sheets obtained by transfer using the pieces of the embossed film at distances from the transfer start position of 1 m, 30 m, and 150 m, the number of transfer defects was less than 1% of the number of all the resin fillers. In addition, a position shift did not occur in the successfully transferred resin filler. The position shift refers to an event in which the position of the center of the resin filler is shifted from the target position by 10% (in the Example, 0.5 μm) or more of the average particle diameter of the resin filler. Furthermore, for the transferred resin fillers, there was no place in which consecutive 10 or more transfer defects occurred in the same direction.

In the embossed film according to Example, concavities are arranged in a hexagonal lattice form, which is the densest arrangement pattern. Hence, when resin fillers are put in the embossed film according to Example and are transferred, the resin fillers are transferred with the densest arrangement pattern. Referring to the results of the embossed film according to Example, even in the case of transfer with the densest arrangement pattern, the success rate of transfer of resin fillers was high, the number of transfer defects was less than 1%, and a position shift etc. of the resin filler did not occur.

Therefore, it can be seen that the embossed film according to the present embodiment has been able to be stably transferred at points of, when 150 m is taken as 100%, 0.67% (i.e., a distance of 1 m), 20% (i.e., a distance of 30 m), and 100% (i.e., a distance of 150 m). Further, similar results were exhibited also at points between 0.67% and 20% and between 20% and 100%. Thus, in an area where concavities are provided, the embossed film according to the present embodiment and the transfer copy using the embossed film are expected to exhibit similar effects to Example whatever arrangement pattern the concavities are arranged with.

Comparative Example

Next, an embossed film according to Comparative Example was produced by the following steps.

First, a 10 cm×10 cm flat plate of stainless steel was subjected to machining, and thereby a stamper master in which a concave-convex structure similar to Example (an arrangement pattern in which convexities of a circle with a diameter of 7 μm were arranged in a hexagonal lattice form, with the distance between the centers of convexities set to 10 μm and the height of the convexity to 7 μm) was formed was produced.

Subsequently, a photocurable resin composition containing 100 parts by mass of an acrylate resin of M208 (produced by Toagosei Co., Ltd.) and 2 parts by mass of a photopolymerization initiator of IRGCUR 184 (produced by BASF SE) was applied with a film thickness of 30 μm to a base material film made of PET with a width of 50 cm (film thickness: 50 μm). The stamper master mentioned above was repeatedly pressed against the base material film at a temperature of 60° C. and a pressure of 2 MPa, and thereby the concave-convex structure was transferred; thus, an embossed film was produced. The stamper master was used while a fluorine-based mold release agent of Daifree GA70500 (produced by Daikin Industries, Ltd.) was sprayed to the transfer surface.

In the embossed film according to Comparative Example, a defect occurred due to resin clogging etc. to the stamper master every time transfer was repeated. Specifically, the rate of loss was evaluated at a point of 20 m (transfer: 200 times) using an optical microscope in a similar manner to Example, and it was found that the rate of loss was 500 ppm (0.5%). Furthermore, in the embossed film according to Comparative Example, the feeding of the film was not constant, and consequently a position shift occurred in the arrangement of the concave-convex structure in each transfer of the stamper master.

In the embossed film according to Comparative Example, the position shift and the rate of loss of concavities are larger than in the embossed film according to Example. Hence, also in a transfer copy obtained by, using the embossed film according to Comparative Example, putting in resin fillers and then transferring the resin fillers, it is presumed that there are similarly more transfer defects than in the transfer copy obtained using the embossed film according to Example.

From the above results, it has been found that, in the embossed film according to the present embodiment, the difference between the rate of loss of concavities in one end portion of the embossed film and the rate of loss of concavities in the other end portion of the embossed film is 10 ppm or less. Thus, the embossed film according to the present embodiment can suppress the cumulative increased amount of loss of concavities even when concavities are formed on a large-area film.

Therefore, the embossed film according to the present embodiment can improve the uniformity of the concave-convex structure in a large-area film, and can reduce the frequency of occurrence of loss of concavities.

The preferred embodiment(s) of the present invention has/have been described above with reference to the accompanying drawings, whilst the present invention is not limited to the above examples. A person skilled in the art may find various alterations and modifications within the scope of the appended claims, and it should be understood that they will naturally come under the technical scope of the present invention.

REFERENCE SIGNS LIST 1 embossed film
4 master
6 transfer apparatus
7 exposure apparatus
10 film main body
11 convexity
13 concavity
15 lost portion
20 filler
30 transfer sheet

The invention claimed is:

1. An embossed film comprising:
    a film main body having a width direction and a length direction, and being a long-length film in the length direction; and
    a plurality of concavities formed on a surface of the film main body,
    wherein a diameter of an opening surface of the concavity is larger than a visible light wavelength,
    wherein an arrangement pattern of the concavities has periodicity along the length direction of the film main body, and
    wherein a difference between a rate of loss of concavities in one end portion of the film main body in the length direction and a rate of loss of concavities in the other end portion of the film main body in the length direction is 10 ppm or less.

2. The embossed film according to claim 1, wherein the rate of loss of concavities is calculated on the basis of concavities in an area corresponding to the same arrangement pattern in one period of the arrangement pattern.

3. The embossed film according to claim 1, wherein the concavities formed on the film main body have substantially the same shape.

4. The embossed film according to claim 1, wherein the arrangement pattern of the concavities is a lattice form.

5. The embossed film according to claim 1, wherein the number density of the concavities is 50,000,000/cm2 or less.

6. The embossed film according to claim 1, wherein the film main body includes a coating layer made of an inorganic compound in at least part of a surface including an interior of the concavity.

7. The embossed film according to claim 1, wherein the film main body is formed of a hardenable resin or a plastic resin.

8. A sheet film formed by cutting the embossed film according to claim 1 into a plurality of sheets.

9. A transfer copy, wherein, using the embossed film according to claim 1 or a sheet film formed by cutting the embossed film into a plurality of sheets, a minute solid body is transferred in a position corresponding to the arrangement pattern.

10. A transfer copy, wherein, using the sheet film formed by cutting the embossed film according to claim 8, a minute solid body is transferred in a position corresponding to the arrangement pattern.

11. The embossed film according to claim 1, wherein the embossed film is an embossed film used in printed electronics or a field of application of printed electronics.

12. The embossed film according to claim 1, wherein the embossed film is an embossed film for medical treatment or bioscience.

13. The embossed film according to claim 1, wherein the embossed film is an embossed film for health care.

14. The embossed film according to claim 1, wherein the embossed film is an embossed film for life science.

15. The embossed film according to claim 1, wherein the embossed film is an embossed film for an optical element.

16. The embossed film according to claim 1, wherein the embossed film is an embossed film for a battery.

17. The embossed film according to claim 1, wherein the embossed film is an embossed film used in an energy-related field or a vehicle-related field.

18. A method for producing an embossed film, comprising:
forming a plurality of convexities on a peripheral surface of a circular cylindrical or circular columnar master; and
pressing the master against a transfer destination film while rotating the master to transfer concavities corresponding to a shape of the peripheral surface of the master to the transfer destination film and thereby producing a film main body having a width direction and a length direction, and being a long-length film in the length direction,
wherein a diameter of an opening surface of the concavity is larger than a visible light wavelength, and
wherein a difference between a rate of loss of concavities in one end portion of the film main body in the length direction and a rate of loss of concavities in the other end portion of the film main body in the length direction is 10 ppm or less.

19. A transfer copy comprising:
a base material having a width direction and a length direction, and being a long-length film in the length direction; and
a plurality of minute solid bodies transferred to a surface of the base material,
wherein an arrangement pattern of the minute solid bodies has periodicity along the length direction of the base material,
wherein the rate of loss of the minute solid bodies is less than 1% of a total number of the minute solid bodies, and
wherein the total number of the minute solid bodies is the number of the minute solid bodies when the minute solid bodies arranged in the arrangement pattern have no loss.

20. The transfer copy according to claim 19, wherein the transfer copy is used in printed electronics, and a field of application and a related field of printed electronics.

21. The transfer copy according to claim 19, wherein the transfer copy is used as a functional film or a functional device.

22. The transfer copy according to claim 19, wherein the transfer copy is used as a biosensor or a diagnostic device.

23. The transfer copy according to claim 19, wherein the transfer copy is used as an optical element.

24. The transfer copy according to claim 19, wherein the transfer copy is used in a battery-related or energy-related field.

25. The transfer copy according to claim 19, wherein the transfer copy is used in a vehicle-related field.

26. A transfer copy comprising:
a base material having a width direction and a length direction, and being a long-length film in the length direction; and
a plurality of minute solid bodies transferred to a surface of the base material,
wherein an arrangement pattern of the minute solid bodies has periodicity along a length direction of the base material,
wherein a defect rate of the minute solid bodies is less than 1% of a total number of the minute solid bodies, and
wherein the total number of the minute solid bodies is the number of the minute solid bodies when the minute solid bodies arranged in the arrangement pattern have no defects.

27. The transfer copy according to claim 26, wherein the transfer copy is used in printed electronics, and a field of application and a related field of printed electronics.

28. The transfer copy according to claim 26, wherein the transfer copy is used as a functional film or a functional device.

29. The transfer copy according to claim 26, wherein the transfer copy is used as a biosensor or a diagnostic device.

30. The transfer copy according to claim 26, wherein the transfer copy is used as an optical element.

31. The transfer copy according to claim 26, wherein the transfer copy is used in a battery-related or energy-related field.

32. The transfer copy according to claim 26, wherein the transfer copy is used in a vehicle-related field.

* * * * *